United States Patent [19]

Baur et al.

[11] Patent Number: 4,470,007

[45] Date of Patent: Sep. 4, 1984

[54] APPARATUS FOR TESTING THE ELECTRICAL BREAKDOWN RESISTANCE POTENTIAL OF INSULATING MEDIA AND/OR COOLING MEDIA

[75] Inventors: Josef Baur, Sulz; Armin Bernhart, Schlins; Roland Ellensohn, Götzis, all of Austria

[73] Assignee: Baur Prüf - und Messtechnik KG, Sulz, Austria

[21] Appl. No.: 362,079

[22] Filed: Mar. 26, 1982

[30] Foreign Application Priority Data

Apr. 1, 1981 [AT] Austria .................................. 1524/81
May 29, 1981 [AT] Austria .................................. 2400/81

[51] Int. Cl.³ ............................................ G01R 31/02
[52] U.S. Cl. .......................................... 324/51; 324/122
[58] Field of Search .......................... 324/51, 54, 122; 361/382, 385

[56] References Cited

U.S. PATENT DOCUMENTS

| 1,401,627 | 12/1921 | Mateer | 324/54 |
| 1,565,721 | 12/1925 | Empson | 324/54 |
| 1,686,689 | 10/1928 | Fortescue | 324/122 |

FOREIGN PATENT DOCUMENTS

| 0994527 | 6/1965 | United Kingdom | 324/54 |
| 0202325 | 12/1967 | U.S.S.R. | 324/54 |

Primary Examiner—Stanley T. Krawczewicz
Assistant Examiner—Jose M. Solis
Attorney, Agent, or Firm—Toren, McGeady and Stanger

[57] ABSTRACT

The invention relates to an apparatus for testing the electrical breakdown resistance potential of insulating media and/or cooling media, especially of synthetic insulating oils for transformers, transducers, switches or the like, having a container and, arranged therein, electrodes which form an adjustable spark distance.

33 Claims, 7 Drawing Figures

APPARATUS FOR TESTING THE ELECTRICAL BREAKDOWN RESISTANCE POTENTIAL OF INSULATING MEDIA AND/OR COOLING MEDIA

DESCRIPTION OF THE PRIOR ART

Such apparatuses are known (Austrian Pat. No. 333.379). This known apparatus has a container for the reception of the media which are to be tested for electrical breakdown resistance potential. Arranged inside this container is a spark distance with two electrodes. The two electrodes of the spark distance are each supported by a shaft. One of these shafts is axially movable for adjusting the spark distance. This shaft is at the same time axially adjustable in a guidance. For the adjustment a threaded screw is here provided which projects into an axial threaded borehole of this shaft. By turning the set screw or adjusting screw, the aforementioned shaft is shifted axially, so that spark-over distance can be adjusted. The magnitude of the spark-over distance can be adjusted. The magnitude of the spark-over distance or breakdown distance is given by the test specifications. This breakdown distance or spark distance must be adjusted when the apparatus is calibrated. An adjustment of the electrodes during operation is not provided in this case.

According to the aforementioned test specifications, which are regulated by agreements between countries and, in part, international agreements, it is also provided that a container filling is loaded several times in a time sequence until breakdown. The apparatus mentioned and described at the outset, and also the previous test specifications, have thoroughly proved themselves. Of course, difficulties have now arisen by reason of the fact that in the modern construction of electrical machines and apparatuses the transition has been made from mineral insulating oils to synthetic oils. These synthetic insulating oils, which are without doubt outstanding as regards their insulating and cooling characteristics, have, of course, the disadvantage in comparison with the long-used mineral oils that in the event of a breakdown the electrodes become very dirty, so that after each enforced breakdown in the testing apparatus the electrodes must be taken out and cleaned before the next breakdown could be made in the testing cycle, failing which only false test results could be obtained. It is evident that by this continuous cleaning the testing process has been made considerably more difficult.

SUMMARY OF THE INVENTION

Here the invention has its starting point, its object being so to construct the apparatus that at least one complete test cycle can be performed without the spark distance having to be cleaned after each breakdown. This solution of the task is, according to the invention, successfully achieved in that: Spark distances formed by several electrodes are provided inside the container, and the spacing of paired electrodes, each pair forming a spark distance, changes in alternating time sequence during the test process. According to a useful embodiment of the invention, a shaft supporting an electrode of a spark distance and supported axially movably in a guidance is in effective connection with a camshaft or crankshaft; and by turning the camshaft or crankshaft during the testing the movably supported electrodes can be moved in alternating time sequence over the distance which is provided for the breakdown test. Thanks to this measure it is possible to preserve as many spark distances as the number of breakdowns per filling which is provided by the prescribed test cycle, and then during the test process, one after another in time gradation, to push the electrodes of a spark distance together to the provided breakdown distance, and then to apply the test voltage. Thanks to the proposal according to the invention, a new spark distance, so to speak, is available after each breakdown and it is only after the test cycle is concluded that the cup is emptied and the electrodes are cleaned.

BRIEF DESCRIPTION OF THE DRAWING

To illustrate the invention, embodiments are explained in detail. The following are shown.

A final embodiment is shown in longitudinal section in FIG. 6 and in cross-section in FIG. 7.

DESCRIPTION OF THE PREFERRED EMBODIMENTS

Figure 1:
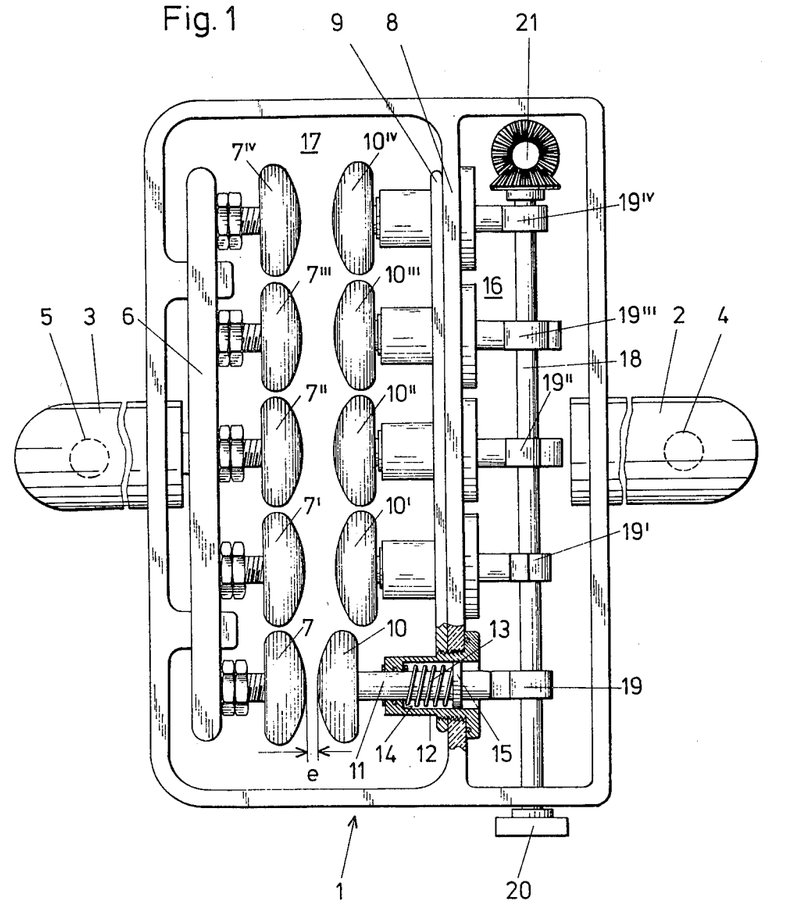
FIG. 1, the top view of an oil test container (test cup) in a first embodiment.

Of the apparatus for testing the breakdown resistance potential of the insulating media, FIG. 1 shows, in cross-section only, the container 1. This is the so-called test cup, in which the insulating oil is to be tested. On diametrically opposite sides of this container 1 are arranged the shaft-like contact members 2 and 3, with pocket boreholes 4 and 5 provided on their underside, by means of which pocket boreholes 4 and 5 the container 1 is fitted upon (not illustrated) test electrodes of a test apparatus. On the inside of the container, the one contact member 3 is connected with a kind of bus bar 6, which supports electrodes 7,7',7",7''' and $7^{IV}$ which are situated beside one another. This container 1 has also a partition 8. On this partition 8, there is disposed another bus bar 9 which is connected with the second contact member 2. On this bus bar 9 are provided the respective second electrodes 10, 10', 10", 10''' and $10^{IV}$, which—together with the electrodes 7 to $7^{IV}$ which are situated coaxially opposite them—form the aforementioned spark distances. These electrodes $10$–$10^{IV}$ are supported by shafts 11. Each shaft is guided axially movably in a bushing 12. There is inserted in the bushing 12 a small compression spring 13 which is penetrated by the aforementioned shaft 11 of the electrode 10. This spring 13 braces itself on the one hand on the floor 14 of the bushing 12, and on the other hand on a collar 15 disposed on the shaft 11, which collar 15 is guided in the interior of the bushing. The electrodes 10' to $10^{IV}$ are held by means of these springs in the position visible in FIG. 1. Several boreholes for receiving these bushings are provided in the partition 8. These bushings have an exterior thread with which they are screwed into a corresponding borehole of the bus bar 9, as shown in FIG. 1.

In the secondary chamber 16 of the container 1 which is delimited by the partition 8, a camshaft 18 is situated of which the individual cams 19, 19', 19", 19''', $19^{IV}$ are in operative contact with the shafts of the movably supported electrodes $10$–$10^{IV}$. The one end of the camshaft 18 is guided toward the outside and fitted with a knob 20 with which the camshaft can be turned manually. It is useful that a scale also is provided here on which the particular angular position of the camshaft or position of the individual electrodes 10-10$^{IV}$ can be read. The other end of the shaft is here guided toward the outside indirectly via a bevel drive 21, in which arrangement the outer portion of this shaft, which is not visible in the drawing, has a plug-in coupling which positions the angle of rotation, and which can be connected with a drive shaft on the apparatus when the container is slipped onto the (not shown) test electrodes. The container 1 can be shut by means of a lid such as is usual with such apparatuses. The arrangement here is devised in such a way that the axes of the spark distances which are arranged side by side are parallel to one another. Furthermore, the camshaft 18 is situated in or at least parallel to the planes formed by these axes of the spark distances. This makes a simple construction of the test cup possible.

The function briefly is as follows: The container 1 (test cup) is filled with the oil to be tested, the camshaft 18 is turned via the knob 20 to the position visible in FIG. 1, and thereby the electrodes 7 to 10 of the first spark distance are moved to the breakdown distance e given by the test specifications. The container is slipped onto the test electrodes of the apparatus and then shut by means of a lid. Now the test voltage is run up to the spark-over. After the spark-over has taken place, the camshaft 18 is turned by means of a motor drive via the bevel drive 21, so that now the electrode 10′ of the second spark distance in the apparatus is pushed to the breakdown distance e. At the same time, subject to the force of the tensioned spring 13, the electrode 10 of the first spark distance simultaneously travels back to its starting position. This starting position corresponds to the position of the electrodes 10-10$^{IV}$ of FIG. 1. Once the electrode 10′ has been pushed the given distance e via the cam 19′ of the camshaft 18, the drive mechanism for the camshaft is stopped and the test voltage is then run up again until it comes to the breakdown on this second spark distance. After the breakdown the camshaft 18 is now turned again via the (not shown) drive mechanism and the alternating play described above starts again. These processes are repeated thereafter for the remaining electrodes 10″-10$^{IV}$ until the testing process has been concluded. The container 1 (test cup) is now emptied and the electrodes are cleaned.

Figure 2:
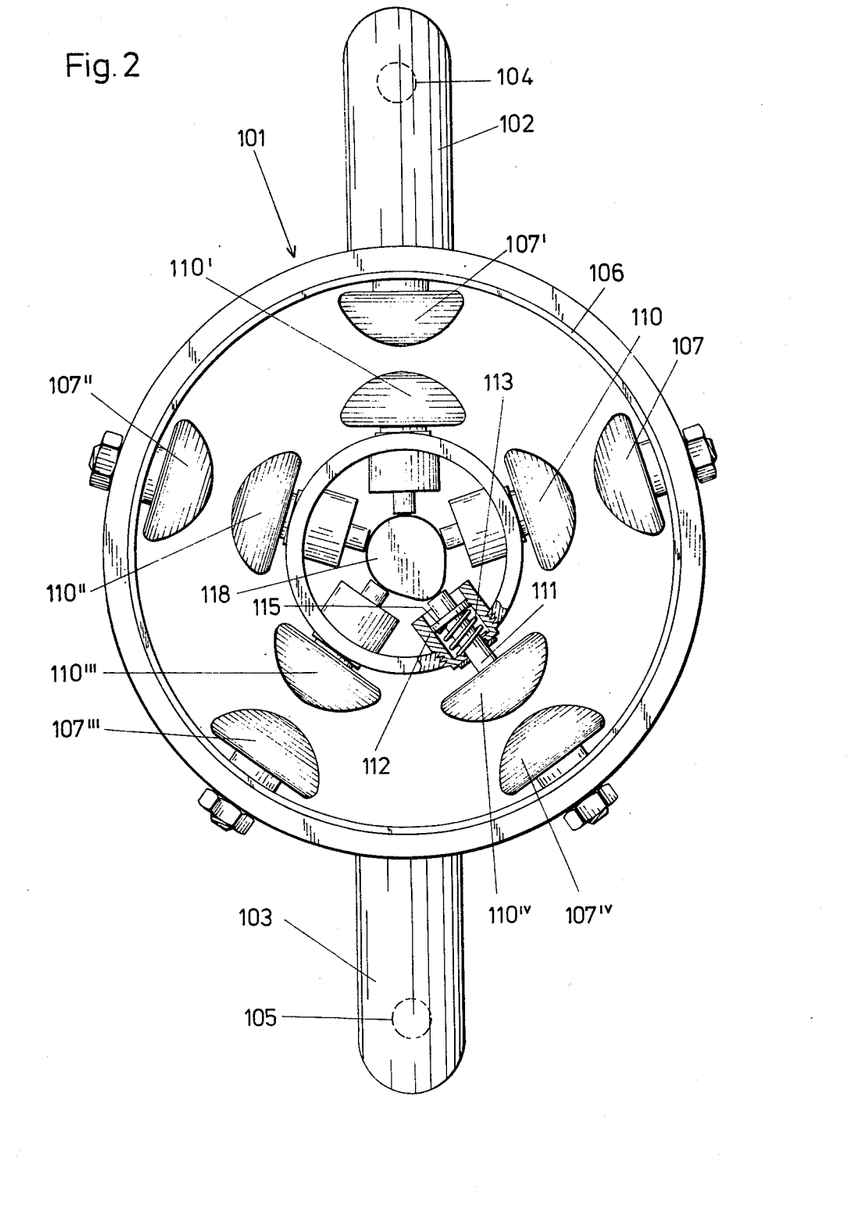
FIGS. 2, and 3, in still another embodiment.

FIG. 2 shows in top view a second embodiment in which the axes of the individual spark distances respectively form angles with each other. These axes here are situated in one plane. A central shaft 118 with a cam effects in time sequence the axial shift of the electrodes 110-110$^{IV}$. The stationary electrodes 107-107$^{IV}$ are here attached directly on the outer wall of the cylindrical container 101 (test cup) and are electrically connected with each other by means of a ring 106 situated on the inside of the container. With this container also, contact members 102 and 103 are provided at positions diametrically opposite each other, whose underside has pocket boreholes 104 and 105 for slipping the test cup onto the (not shown here) electrodes of the testing apparatus. The mode of functioning of this cylindrical test cup with vertical axis follows directly from what has already been said.

As to construction, it may also be mentioned in this connection with the design according to FIG. 2 that the axes of the individual spark distances could also lie in planes parallel to each other, which would, of course, necessitate a greater structual height of the container 101, and also a more complicated camshaft, because then several cams will have to be provided on this shaft. The shift of the one electrode by means of a camshaft can structurally be accomplished with relative simplicity. This construction presupposes that a restoring force acts upon each of the movable electrodes, forcing them back into their starting position. In principle it would be possible to use a crankshaft instead of a camshaft and to accomplish the shifting of the shaft by means of a piston rod. In this case the restoring spring could be dispensed with. Of course, this again requires a more expensive shaft construction.

Figure 3:
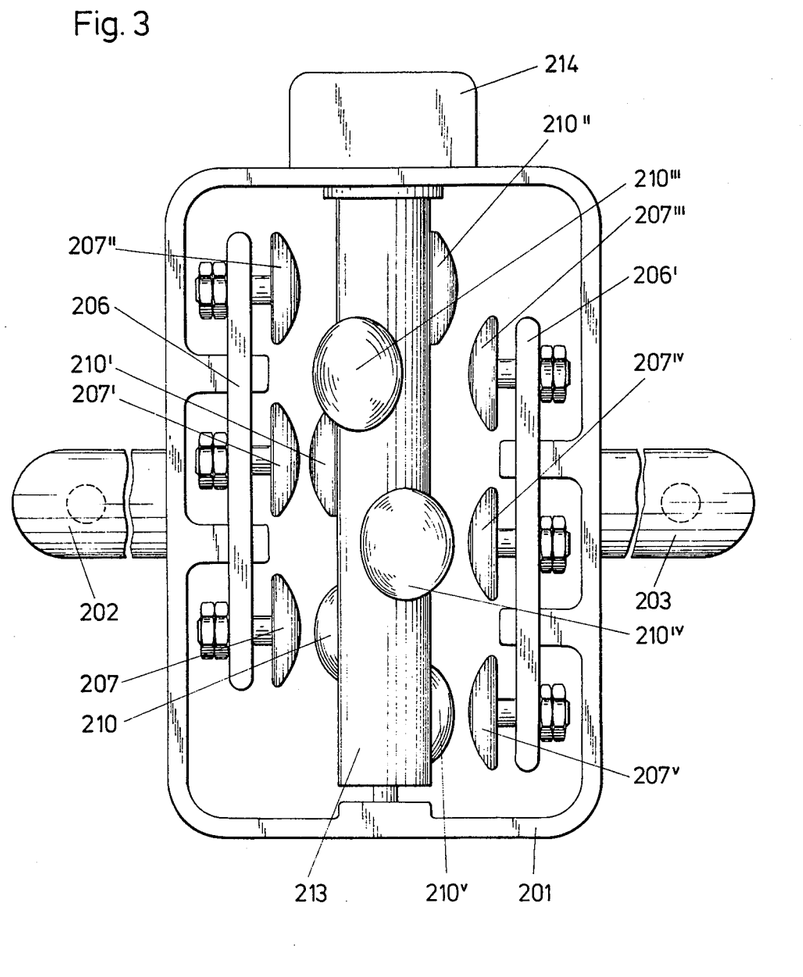

The embodiment according to FIG. 3 also shows a test cup in top view. This test cup also has two contact members 202 and 203 arranged diametrically opposite each other. In this test cup there are provided two bus bars 206 and 206′ on the periphery which support stationary electrodes 207, 207′, 207″, etc. These electrodes are directed towards each other and are offset by half the distance toward one another, relative to the longitudinal extension of the bus bars 206 and 206′. These bus bars 206 and 206′ are in electrically conductive connection with one of the two contact members 202 and 203. Between these two rows of stationary electrodes, there is supported a shaft 213 which can be turned gradually and which supports the electrodes 210, 210′, 210″, etc. These electrodes are staggered in relation to each other in the axial direction of the shaft 213 as well as in their circumferential direction. On one side this shaft 213 is supported on or in the wall of the container 201. On the opposite side of this container 201, in a small housing 214, a stepping motor is provided which serves to drive this shaft 213. The shaft 213 and the electrodes 210, 210′, 210″, etc. are constructed in one piece. Due to the staggering of the stationary electrodes on the one hand, and by the staggering of the movable electrodes 210, 210′, 210″, etc. of the rotatable shaft 213, the effect is achieved that each electrode 210, 210′, 210″, etc. of the rotating shaft 213 during one complete rotation (360°) is moved with a stationary electrode only a single time over the distance provided for the testing. Naturally it would be possible in principle to dispose the stationary electrodes 207, 207′, 207″, etc. in a single row. The test cup would then have to be constructed in a corresponding length.

Not shown in the figures, but suitable to the purpose, is the arrangement of a small stirring apparatus in the containers 1, 101 and 201, in a manner known in test cups for insulating media.

Figure 4:
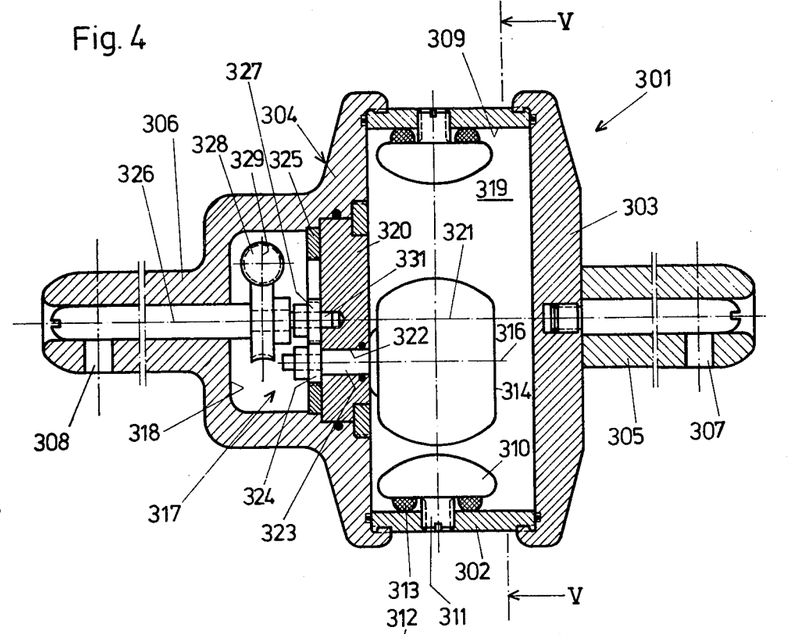
FIG. 4, a longitudinal section.
Figure 5:
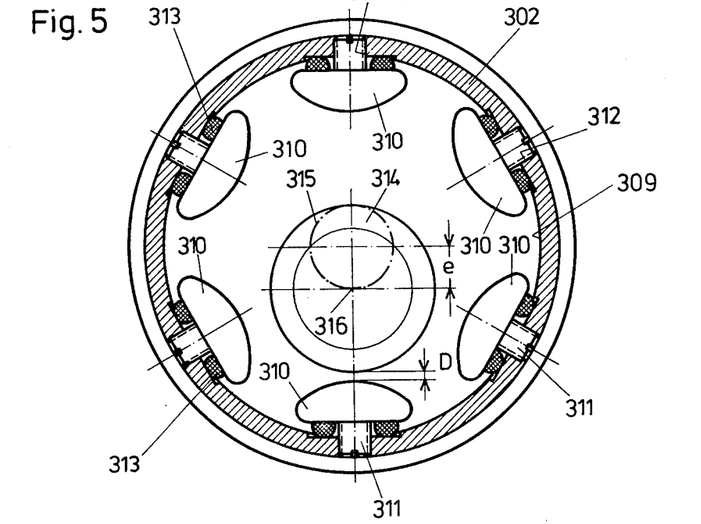
FIG. 5, a cross-section according to the line V—V in FIG. 1 of an additional embodiment.

FIGS. 4 and 5 show a further embodiment. The apparatus shown here for testing the electrical breakdown resistant potential has a container 301 which is composed of a cylindrical wall member 302 with laterally locking frontal caps 303 and 304 which bear shaft-like contact members 305 and 306 for conducting the test voltage. These frontal caps 303 and 304 are screwed onto the cylindrical wall member 302 and sealed off in relation to the latter. These contact members 305 and 306 have at their end pocket boreholes 307 and 308 with which the container 301 is fitted upon the (not shown here) test electrodes of a testing apparatus. On the inside 309 of the cylindrical wall member 302, several electrodes 310 are disposed at equal angular distances. These electrodes 310 carry, at their rear, threaded pins 311 which are screwed into threaded boreholes 312 in the cylindrical wall member 302. These threaded pins 311 have slots on their exterior end face in order that a screwdriver catch can be applied here so as in this way to adjust the electrodes. For sealing toward the outside, O-rings 313 are arranged on the rear side of the electrodes 310. Naturally it is also possible to screw these electrodes on from the outside. In this case, threaded boreholes would have to be disposed at the rear of the electrodes and fastening screws would have to be fitted in the cylindrical wall member 302 by means of corresponding through holes. All the electrodes 310 are situated on one circular path and in a cross-sectional plane of the cylindrical wall member 302. Instead of fastening these electrodes 310 directly to the wall member 302, it would also be possible to provide inside the container a support frame or support structure for these electrodes. This, however, would constitute a greater expense. The circular path on which the electrodes 310 are diposed (in the embodiment shown in FIGS. 4 and 5) is formed here by the cylindrical wall member 302. All these electrodes 310 are furnished with a voltage feed line, which for clarity's sake is not shown here. This voltage feedline can be situated inside the cylindrical wall member 302 and can extend along the latter's interior wall 309.

Inside and between these electrodes 310, a central electrode 314 is provided, situated off-center by a distance e in relation to the aforementioned circular path and its central point, and movable in a circular path 315 concentric to the aforesaid circular path. At the same time, the central electrode 314 can be rotated about its own axis on its course in this circular path 315.

For this rotational movement, a planetary gearing 317 is provided. A chamber 318 is hollowed out in the frontal cap 304, and this chamber 318 is closed off by a cylindrical wall disk 320 with respect to container interior 319 for the reception of the insulating medium to be tested. This cylindrical wall disk 320 is supported freely rotatably about its central axis 321 and has, eccentrically in relation to this axis and parallel thereto, a through-hole 322 in which the shaft 323 is supported rotatably which bears at its one end the central electrode 314 and at its end near the chamber has a pinion 324. This pinion 324 is in engagement on the one hand with the interior tooth construction of a gear rim 325 which is stationary in the chamber 318, and is in engagement on the other hand with a gear wheel 327 which can be driven by a worm gear drive and which is situated coaxially in relation to the rotational axis 321 of the cylindrical wall disk 320 and to the axis 326 of the shaft-like contact member 306. The axis 329 of the worm gear drive 328 is situated at a right angle to the axes 326 and 321.

The transmission ratio of the planetary gearing 317 is so selected that a rotation of the shaft 323 of the central electrode 314 comprising 360° corresponds to a rotation of the central electrode 314 which differs from 360°. The shaft 323 of the central electrode is situated parallel to the axis 326 of the shaft-like contact member 306. The central axis 331 of the planetary gearing 317 is disposed coaxially to the axis of the cylindrical wall member 302.

The central electrode 314, as regards its rotational axis 316, is constructed as a rotational body, preferably as a sphere or at least as a flattened sphere.

For the sake of clarity, the contact members which serve to feed the test voltage to the central electrode 314 are not shown here.

The function is briefly as follows: The container 301 is filled with the medium to be tested and the electrodes occupy the positions which can be seen from FIGS. 4 and 5. The container is now slipped onto the test electrodes of the test apparatus. Now the test voltage is run up to the spark-over. After the spark-over has taken place, the central electrode 314 is turned by means of a (not shown) motor drive mechanism by means of the worm gear drive and the planetary gearing 317, so that the central electrode 314 now turns counter to the next outer electrode 310 which immediately follows in circumferential direction, and thus the central electrode 314 forms a second spark distance with the breakdown distance D. Once the central electrode 314 has moved the given distance D, the drive mechanism for the planetary gearing 317 is stopped and following this the test voltage is again run up until it comes to the breakdown on this second spark distance. After the breakdown, the central electrode 314 is now again turned further by means of the drive mechanism (not shown), and the alternating play described above begins again. These processes are repeated in this sequence for the remaining electrodes until the testing process has been concluded. Now the container 1 is emptied and the electrodes are cleaned.

During the described rotation, the central electrode 314 turns about its own axis 316, so that constantly new points on its surface lie opposite the outer electrodes 310. By this means the measurement cycle is controlled in such a way that a clean electrode surface is present with one and the same oil test on each breakdown.

The planetary gearing 317 provides the rotary motion of the spherical central electrode 314 and the latter's simultaneous rotation about its own axis 316. In this way after each spark-over a switch is made, so to speak, to a new and clean electrode surface.

The container can be given a very space-saving construction, so that a small quantity of oil can be found to be sufficient for the testing process.

The spacing of the electrodes can be adjusted in a simple manner. This adjustment is done by means of a gauge with the container open.

The voltage feedline is situated below the oil level; by this means a movement of oil in the calotte feedlines when there is high voltage is avoided.

Idle times are eliminated, because of the required oil circulation between the individual breakdowns.

A shortening of the test time by more than half the time, in comparison with the apparatuses which have been used to date, has consequently become possible.

The container can be opened and cleaned simply and the electrodes can be adjusted simply.

The planetary gearing for the rotational movement of the central electrode 314 provides for a sufficient enlargement of the spacing—by more than $3\frac{1}{2}$ times—with the unused, but nevertheless live, outer electrodes.

The geometric disposition of the live electrodes provides for realistic field conditions such as are present, for example, in a transformer;

In addition, inlet and outlet valves can be provided which permit use of the container as a passage cell for continuous quality control of transformer fillings or cable fillings and in regeneration systems.

In the embodiment shown and described, the outer electrodes are stationary and the central electrode rotates. In principle it is conceivable and possible and should lie also within the scope of this invention to keep the central electrode stationary and to turn the outer electrodes 310 eccentrically about the central electrode, that is, to reverse kinematically the process first described. This, of course, requires a greater mechanical expenditure, so that in practice the first described embodiment must be given the preference.

Figure 6:
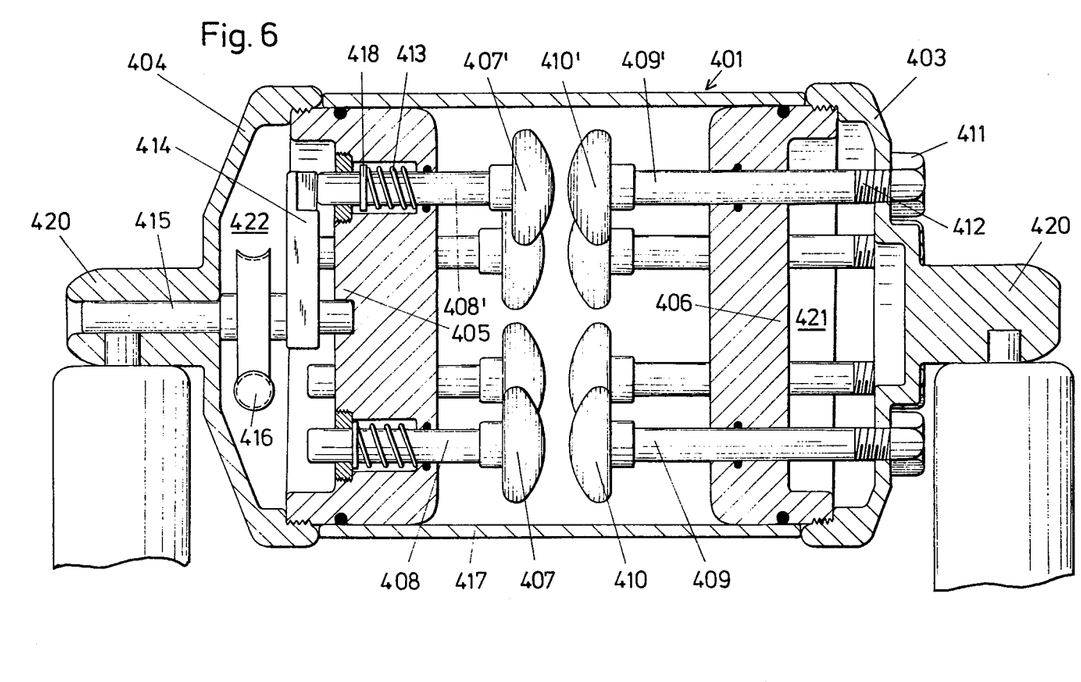
Figure 7:
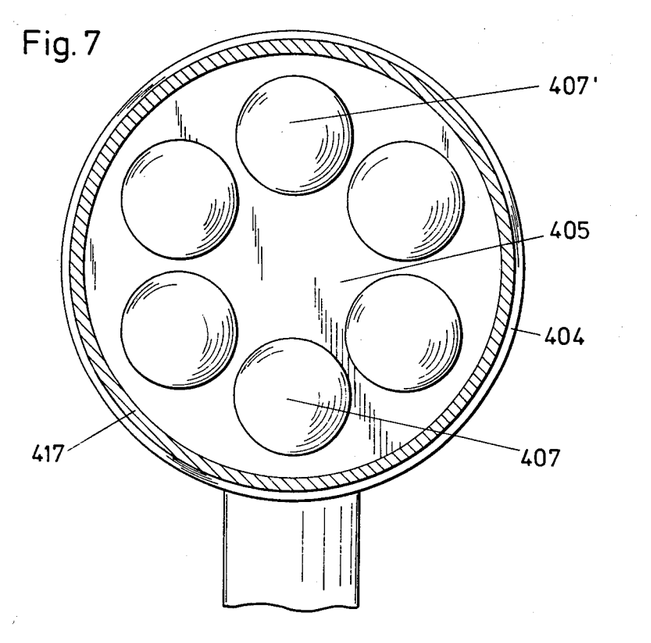

A final embodiment of the invention is shown in FIG. 6 in longitudinal section and in FIG. 7 in cross-section. The container 401 is composed of a cylinder 417—of glass, for example, or a suitable transparent plastic—which is shut on both sides by lids 403 and 404 made of metal and having protruding pins 420 with which the container is slipped onto the electrodes of the testing apparatus, as was described at the outset. Inside this cylindrical container 401, two holding plates 405 and 406 are inserted and are connected firmly with the lids; these holding plates 405 and 406 also, expediently, are of metal. These holding plates 405 and 406, together with the lids 404 and 403 respectively adjacent to them, delimit chambers 421 and 422. The holding plate 406 supports the stationary electrodes 410, 410', which each has a shaft 409, 409' which bears at its end a thread 412 with which these shafts are screwed into a corresponding threaded borehole in the lid 403. A counternut 414 secures the firm seating.

The second holding plate 405 supports the axially movably supported electrodes 407 and 407', which also have shafts 408 and 408'. In each respective shaft guidance, a spiral spring 413 is provided which at one of its ends is braced against a collar 418 of the respective electrode shaft 408'. Rotatably supported in the chamber 422, coaxially with the shaft 420, is a shaft 415 which can be put into rotation by means of a worm gear drive 416. The drive shaft for this worm gear drive 416 is guided outward and not shown here in detail. A cam 414 is seated on this shaft 415, and when the shaft 415 rotates, the cam 414 lifts the movable electrodes 407, 407' one after another and moves them axially to the distance provided for the testing.

In the container 401 there are apertures (not shown) which can be shut preferably by cocks or valves, through which openings the medium to be tested can be brought in. It is also possible, however, for the electrode arrangement and operation shown here in FIGS. 6 and 7 to be arranged in an open test container, that is, in a tub-shaped test container. The manner of functioning of the apparatus here described (FIGS. 6 and 7) follows directly from what has previously been said.

Not only is the apparatus according to the invention usefully utilized for the testing of synthetic oils for the above-named reasons; it can also just as usefully be employed for mineral oils which have long been in use. In testing the breakdown resistance potential of mineral oils with simple spark distances, it was necessary, in consideration of the testing regulations between countries and international testing regulations, for the quantity of oil in the testing cup to be constantly stirred up throughout a certain time span. When the apparatus according to the invention is used, one spark distance after the other can be activated in alternating sequence during the testing process. Agitation of the quantity of oil is eliminated. Consequently the time span provided for the testing is substantially reduced.

We claim:

1. Apparatus for testing the electrical breakdown resistance potential of insulating media and/or cooling media, especially of synthetic insulating oils for transformers, transducers, switches or the like, comprising a container, electrodes disposed within said container and arranged to form an adjustable spark distance, characterized in that said electrodes are positioned inside said container so that at least one of said electrodes is movable relative to the other said electrodes for providing a plurality of pairs of said electrodes, and means for changing in alternating time sequence the spark distances formed by each pair of said electrodes 2. Apparatus according to claim 1, characterized in that said electrodes comprise pairs with each said pair comprising a movable electrode and a stationary electrode, a shaft supporting each said movable electrode a guidance for said shaft so that said movable shafts are supported axially movable, a camshaft means in operative engagement with said shafts for positioning the said movable electrodes relative to said stationary electrodes in said pair so that, by the turning of said camshaft means during the testing said movably supported electrodes can be moved the distance provided for the breakdown testing in alternating time sequence.

3. Apparatus according to claim 1 or claim 2, characterized in that said pairs of electrodes have the axes of said spark distances adjacent to each other in essentially parallel relation, and in that said camshaft means is situated in one of and parallel to the plane forming the axes of said spark distance.

4. Apparatus according to claim 1 or claim 2, characterized in that said pairs of electrodes have the axes of said spark distances formed thereby spaced angularly apart from one another and said camshaft means is at right angles to the axes of said spark distances.

5. Apparatus according to claim 1 or claim 2, characterized in that the axes of said spark distances are situated on one plane.

6. Apparatus according to claim 4, characterized in that the axes of said spark distances are disposed in planes parallel to each other.

7. Apparatus according to claim 2, characterized in that said camshaft means comprises a camshaft guided from the inside to the outside of said container 1, an operating knob 20 on said camshaft outside said container and serving to turn said camshaft manually, and an adjustment scale positioned on said knob.

8. Apparatus according to claim 7, characterized in that the other end of said camshaft from said knob is guided outwardly, relative to said container, a plug-in coupling at the other end of said camshaft, and a drive shaft connected to said plug-in coupling.

9. Apparatus according to claim 1 or claim 2, characterized in that a bushing is provided for the guidance of each said shaft of said movably supported electrodes, each said bushing having a compression spring which is axially penetrated by said shaft and a collar provided on said shaft for bracing said compression spring.

10. Apparatus according to claim 2, characterized in that a turning shaft is supported in said container, said movably supported electrodes are supported on said turning shaft and said movably supported electrodes are staggered with respect to each other in the axial direction as well as in the circumferential direction of said shaft 213.

11. Apparatus according to claim 10, characterized in that said shaft and said movably supported electrodes are manufactured in one piece.

12. Apparatus according to claim 10, characterized in that said shaft is disposed centrally between two opposite rows of said stationary electrodes.

13. Apparatus according to claim 12, characterized in that said stationary electrodes of the rows situated opposite each other are staggered with respect to each other.

14. Apparatus according to claim 1, characterized in that a plurality of said electrodes are spaced at equal angular distances apart on a circular path inside said container, and in that radially inwardly from said angularly spaced a central said electrode is provided which is situated off center relative to the aforementioned circular path, and in that one of said central electrode said angularly spaced electrodes is movable on a path concentric to said circular path.

15. Apparatus according to claim 14, characterized in that said central electrode can be turned about its axis along the circular path traveled by it.

16. Apparatus according to claim 14, characterized in by a planetary gearing including an output shaft, and said central electrode is connected with said output shaft.

17. Apparatus according to claim 14, characterized in that said container comprises a cylindrical wall member and frontal caps closing the opposite ends of said wall member and a contact member supported centrally on each said frontal cap.

18. Apparatus according to claim 17, characterized in that said angularly spaced electrodes are attached on the inside of said cylindrical wall member.

19. Apparatus according to claim 14, characterized in that said central electrode is rotatable and as regards its rotational axis said central electrode is constructed as a rotational body.

20. Apparatus according to claim 17 or claim 19, characterized in that said central electrode is at least partly spherically shaped.

21. Apparatus according to claim 16, characterized in by a shaft-like contact member, and said output shaft supporting said central electrode is situated parallel to the axis of said shaft-like contact member.

22. Apparatus according to claim 16, characterized in by a cylindrical wall member, said planetary gearing has a central axis situated coaxially with the axis of said cylindrical wall member.

23. Apparatus according to claim 17, characterized in that said planetary gearing has a central axis situated coaxially with the axis of said contact member.

24. Apparatus according to claim 17, characterized in that one said frontal cap forms a chamber and a planetary gearing is disposed in said chamber.

25. Apparatus according to claim 24, characterized in that a wall disk seals off said chamber from the interior of said container said wall disk is supported rotatably about in axis in said frontal cap which has a borehole parallel and eccentric in relation to its rotational axis, said shaft of said central electrode being situated rotatably in said borehole.

26. Apparatus according to claim 25, characterized in that a gear rim with an interior tooth construction is fixed in said chamber, said central electrode has a shaft, a drive pinion on said shaft of said central electrode, and said drive pinion of said shaft 323 of said central electrode 314 rolls off said gear rim.

27. Apparatus according to claim 23, characterized in by a worm gear drive driving said planetary gearing, and in that the axis of the worm wheel drive is at right angles to the axis of said shaft-like contact member.

28. Apparatus according to claim 17, characterized in that said frontal caps are screwed on said cylindrical wall member.

29. Apparatus according to claim 16, characterized in that the transmission ratio of said planetary gearing is so selected that in a complete 360° rotation of said output shaft different surface points of said central electrode are situated opposite said angularly spaced electrodes.

30. Apparatus according to claim 17, characterized in that at least one of said cylindrical wall member and said frontal caps have inlet and outlet apertures with stop valves.

31. Apparatus according to claim 2, characterized in that the axes of said spark distances of said pair of electrodes are disposed parallel to each other and said electrodes of one spark distance are arranged on a closed path.

32. Apparatus according to claim 31, characterized in that said movable electrodes of said spark distance are supported so as to be axially movable, a rotating cam for lifting said movable electrodes having a rotational axis situated parallel to the axis of said spark distances.

33. Apparatus according to claim 32, characterized in that a worm gear drive drives said cam.

* * * * *